United States Patent
Shau

(10) Patent No.: US 6,216,246 B1
(45) Date of Patent: *Apr. 10, 2001

(54) METHODS TO MAKE DRAM FULLY COMPATIBLE WITH SRAM USING ERROR CORRECTION CODE (ECC) MECHANISM

(76) Inventor: Jeng-Jye Shau, 991 Amarillo Ave., Palo Alto, CA (US) 94303

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 4 days.

(21) Appl. No.: 08/989,841

(22) Filed: Dec. 12, 1997

Related U.S. Application Data

(63) Continuation-in-part of application No. 08/653,620, filed on May 24, 1996, now Pat. No. 5,748,547.

(51) Int. Cl.[7] .................................................. G11C 29/00
(52) U.S. Cl. ........................................... 714/763; 714/758
(58) Field of Search .................................... 714/763, 805, 714/754, 762, 758; 326/55; 257/207

(56) References Cited

U.S. PATENT DOCUMENTS

| | | | | |
|---|---|---|---|---|
| 4,295,218 | * | 10/1981 | Tanner ................................. | 714/762 |
| 4,775,810 | * | 10/1988 | Suzuki et al. ........................... | 326/55 |
| 5,127,014 | * | 6/1992 | Raynham ............................... | 714/754 |
| 5,160,997 | * | 11/1992 | Sandoh et al. ......................... | 257/207 |
| 5,224,107 | * | 6/1993 | Mattes ................................... | 714/805 |
| 5,375,127 | * | 12/1994 | Leak et al. ............................. | 714/763 |

* cited by examiner

Primary Examiner—Albert De Cady
Assistant Examiner—David Ton
(74) Attorney, Agent, or Firm—Bo-In Lin

(57) ABSTRACT

This invention provides practical methods to make a DRAM fully compatible with existing SRAM products. This is accomplished by design and manufacture methods according to the invention, which includes a method to reduce standby power of reference voltage generators and a method to avoid the alpha particle problem using a novel error correction code (ECC) mechanism. The reference voltage generator of the present invention can adjust the values of output voltage and driving power separately following simple procedures. It has very strong driving power to maintain the reference voltage, which is necessary to support high-speed operation of memory devices of the present invention. In the mean time, its standby power can be reduced by orders of magnitudes using simple control mechanism, which is necessary to make our memory device compatible with the properties of existing SRAM products. There is no need to use feedback circuits or operation amplifiers, so the circuit is extremely stable and reliable. It is an ideal reference voltage generator to generate the bit line pre-charge voltage for a DRAM designed to emulate an SRAM device. The unique features of the ECC protection of the present invention avoid RC delay problems in prior art ECC circuits, which is necessary to support high speed operation of our products. The alpha particle problem is no longer an issue. All the supporting circuits can use repeated layouts, which is very important for memory design. The manufacture technology for embedded IC is simplified dramatically, which allow us to have high performance logic circuits. The memory devices of the present invention are therefore compatible in every detailed feature with existing SRAM products.

5 Claims, 14 Drawing Sheets

METHODS TO MAKE DRAM FULLY COMPATIBLE WITH SRAM USING ERROR CORRECTION CODE (ECC) MECHANISM

This application is a CIP of 08/653,620 May 24, 1996 U.S. Pat. No. 5,748,547.

BACKGROUND OF THE INVENTION

The present invention relates to methods to make a dynamic random access memory (DRAM) fully compatible with a static random access memory (SRAM).

DRAM and SRAM are two major types of memory devices in the Integrated Circuit (IC) industry. DRAM of current art always has lower performance relative to SRAM, while SRAM is more expensive. Therefore, DRAM of current art is used for cost-sensitive applications, while SRAM is used for applications that require performance, power efficiency, or user-friendliness. Since the logic circuits of current art is operating at much high frequencies than DRAM, memory access operations are often the performance bottleneck for computers. A typical solution for this performance bottleneck is to use a large number of low cost DRAM's as the main memory, while using a smaller number of high performance SRAM's as cache memory. This multiple level memory structure provides necessary compromises to balance cost efficiency and performance requirements. However, complex logic circuits are needed to assure data consistency of this memory structure. In many cases, memory operations are still the performance bottleneck for computer systems. It is therefore highly desirable to be able to manufacture high performance and cost efficient memories to remove multiple level memory structures in computer systems.

The need to manufacture different types of memory devices causes tremendous wastes in the IC industry. DRAM's are typically manufactured by 4 layer poly, double layer metal (4P2M) technology; SRAM's are typically manufactured by 2 layer poly, double layer metal (2P2M) technology; logic circuits require technologies with many metal layers such as a single layer poly, 4 layer metal (1P4M) technology. Details of transistor manufacture procedures are also different between memory and logic. DRAM technologies emphasize on leakage current reduction and high voltage tolerance, so it needs to use thick gate, long channel transistors with higher threshold voltage. Logic circuits emphasize on performance, so they prefer thin gate, short channel transistors with lower threshold voltage. An SRAM technology needs to have special modules to build poly resistors. Due to these conflicting requirements, researchers in the IC industry must develop different manufacturing technologies to build DRAM's, SRAM's, and logic circuits separately. It is therefore highly desirable to simplify those conflicting needs from different types of products.

One approach to solve the above long-existing problem is to improve the data access rate of DRAM using parallel processing and pipeline concepts in DRAM design. Well-known products using such approaches are the synchronized DRAM (SDRAM), the RAMBUS system approach, and the multiple-bank DRAM (MDRAM). The major problem for those products is that they are not compatible with existing products. The computer industry does not want to change existing designs to adapt for those new memory structures. The other problem is that these approaches improve data access rate without improving memory latency.

Another approach is to make a DRAM device behaves as an SRAM device using self-refresh circuits. This type of memory device is user-friendly because it has the same interface as conventional SRAM devices. However, they are not very useful because performance of such self-refresh DRAM is as low as conventional DRAM, while it requires high standby power to support self-refresh operations.

The above inventions and developments provided partial solutions to memory design problems, but the computer industry resists to adapt to such partial solutions. Meeting requirements in performance and cost efficiency is not enough. To be successful, a novel solution must be compatible to existing memory devices in every details. U.S. patent application Ser. No. 8,653,620 described methods to make a DRAM as fast as SRAM including a self-refresh mechanism which is completely invisible to external users. U.S. pat. appl. Ser. No. 08/805,290, now U.S. Pat. No. 5,825,704, described methods to build smaller memory device using the same manufacture technologies used to build logic IC products. The above two inventions allow us to make memories faster than SRAM of current art while using silicon area as small as that of DRAM of current art However, there are further detailed problems we must solve to make our products truly compatible with existing industry standards. The present invention is developed to cover those remaining details.

The first issue is the standby power problem. An SRAM consumes almost no power when it is not used. A DRAM consumes power even when the user is not using the memory. There are two major sources for this waste in energy. The most well-known source comes from the memory refresh operations. The self-refresh mechanism described in U.S. pat. appl. Ser. No. 08/653,620, now U.S. Pat. No. 5,748,547, improved energy efficiency for memory refresh, and solved the problem effectively. The other major source comes from the DRAM pre-charge circuits. Bit lines of DRAM are usually pre-charged to a voltage near half of its power supply voltage. In order to make the product fully compatible with SRAM, we must have an internal reference voltage generator to maintain this pre-charge voltage. Reference voltage generators of current art consume standby powers. Because our product is much faster than conventional DRAM, the reference voltage generator need to have much stronger driving capability than those used by conventional DRAM's. It is therefore even more difficult to meet the requirements on standby power. This problem must be solved because the computer industry expects low standby power from SRAM's.

Another important issue is a reliability problem known as "alpha particle problem"—high energy particles hit an integrated circuit, and change the contents of its memory elements. The memory cells used in our previous inventions are more sensitive to the alpha particle problem than conventional SRAM devices. It is therefore desirable to develop an error correction mechanism to correct errors caused by the alpha particle problem.

SUMMARY OF THE INVENTION

The primary objective of this invention is, therefore, to provide practical methods to make a DRAM fully compatible with existing SRAM products. This and other objects are accomplished by design and manufacture methods according to the invention, which includes a method to reduce standby power of reference voltage generators and a method to avoid the alpha particle problem using a novel error correction code (ECC) mechanism.

The reference voltage generator of the present invention can adjust the values of output voltage and driving power separately following simple procedures. It has very strong driving power to maintain the reference voltage, which is necessary to support high speed operation of memory devices of the present invention. In the mean time, its standby power can be reduced by orders of magnitudes using simple control mechanism, which is necessary to make our memory device compatible with the properties of existing SRAM products. There is no need to use feedback circuits or operation amplifiers, so the circuit is extremely stable and reliable. It is an ideal reference voltage generator to generate the bit line pre-charge voltage for a DRAM designed to emulate an SRAM device. The unique features of the ECC protection of the present invention avoid RC delay problems in prior art ECC circuits, which is necessary to support high speed operation of our products. The alpha particle problem is no longer an issue. All the supporting circuits can use repeated layouts, which is very important for memory design. The manufacture technology for embedded IC is simplified dramatically, which allow us to have high performance logic circuits. The memory devices of the present invention is therefore compatible in every detailed feature with existing SRAM products.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1(c) shows the output current versus output voltage of the voltage generator in FIG. 1(a);

DETAILED DESCRIPTION OF THE INVENTION

For a DRAM device, memory bit lines are typically pre-charged to a voltage around half of the power supplier voltage Vcc. In order to make a DRAM fully compatible with existing SRAM devices, this bit line pre-charge voltage must be generated internally. It is therefore necessary to have a reference voltage generator that is invisible to external users. Because our emulated "SRAM" is much faster than conventional DRAM, this internal reference generator must have a driving power much stronger than that of reference voltage generators of current art. To emulate an SRAM which has very small standby power, the voltage generator also need to consume very little standby power. These conflicting requirements for lower standby power and higher driving capability requires novel design.

Figure 1A:
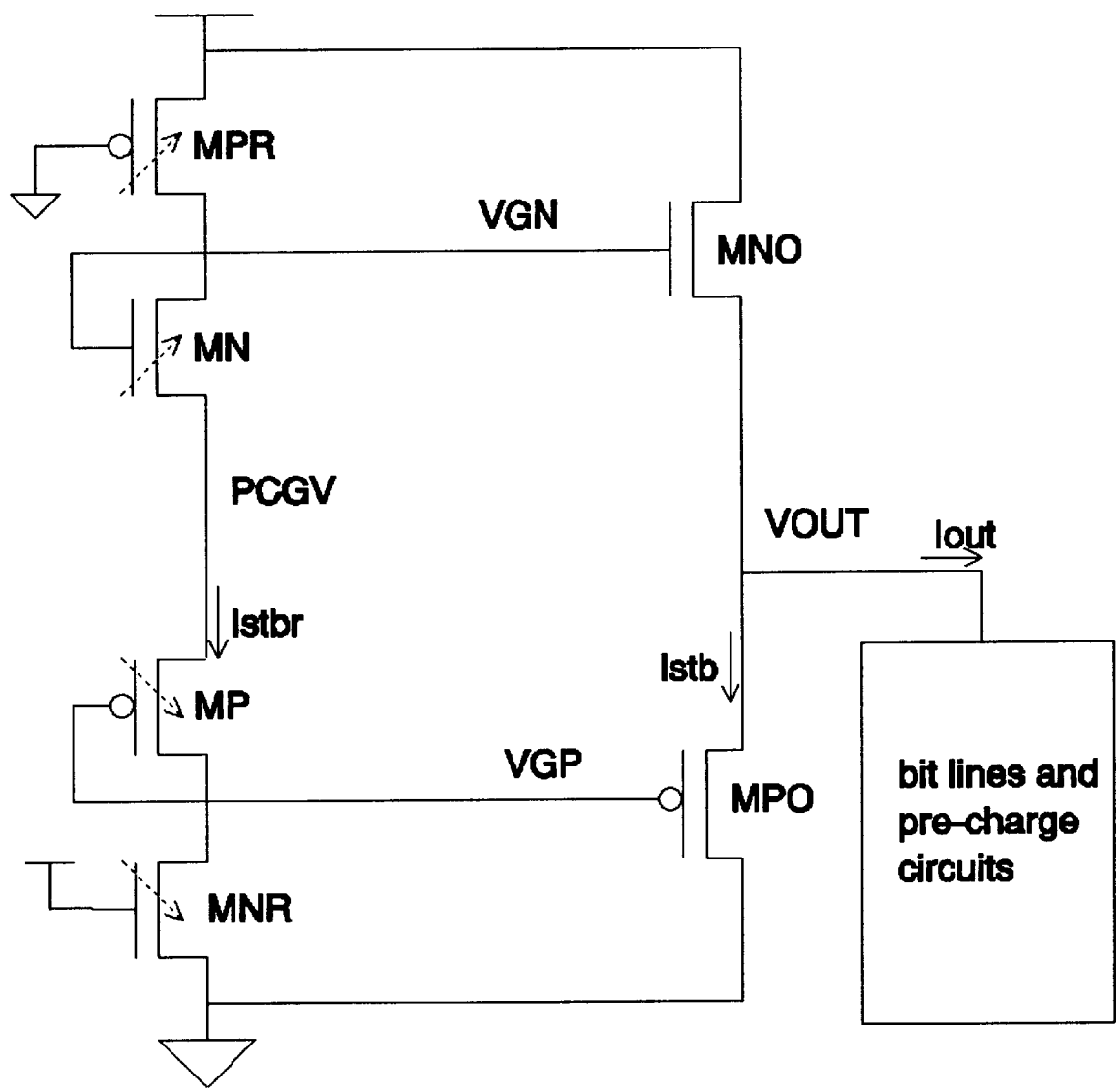
FIG. 1(a) is a schematic diagram for a reference voltage generator of the present invention.

FIG. 1(a) is a symbolic diagram of a reference voltage generator of the present invention. In this figure, we attach a dashed arrow to a conventional transistor symbol to represent a variable size transistor—a transistor whose size is changeable by control signals. For the circuit in FIG. 1(a), the source of a variable size p-channel transistor MPR is connected to Vcc; its gate is connected to ground; its drain is connected to the drain of a variable size n-channel transistor MN, the gate of the same transistor MN, and the gate of an n-channel transistor MNO. The voltage at this node is VGN. The source of the variable transistor MN is connected to the source of a variable size p-channel transistor MP; the voltage at the source of MN is PCGV. Both the gate and the drain of transistor MP are connected to a node at voltage VGP, which is also connected to the gate of a p-channel transistor MPO and the drain of a variable size n-channel transistor MNR The gate of MNR is connected to Vcc. The drains of transistors MPO and MNO are connected to the output of this reference voltage generator at voltage VOUT. This output voltage VOUT is applied to loadings such as bit lines and pre-charge circuits. The output current is Iout. At steady state condition, Iout is zero; there is a standby leakage current Istb leaking from Vcc through output transistor MPO and MNO to ground. There is also a leakage current Istbr leaking from Vcc through variable transistors MPR, MN, MP, MNR to ground as shown in FIG. 1(a).

Using the current to voltage relationship of Metal-Oxide-Semiconductor (MOS) transistors, we have $$Istbr = Gmn*(VGN-PCGV-Vtn)^2 \qquad (1)$$

where Gmn is a constant determined by the carrier mobility and the size of transistor MN, and Vtn is the threshold voltage of transistor MN.

Rearranging Eq. (1), we have $$VGN = PCGV + Vtn + (Istbr/Gmn)^{1/2} \sim PCGV + Vtn \qquad (2)$$

where we used the fact that the third term $(Istbr/Gmn)^{1/2}$ is usually negligible.

Similarly, we have $$VGP = PCGV - Vtp - (Istbr/Gmp)^{1/2} \sim PCGV - Vtp \qquad (3)$$

where Gmp is a constant determined by the carrier mobility and the size of transistor MP, and Vtp is the threshold voltage of transistor MP.

If we describe the current to voltage relationships of transistors MPR and MNR using simplified ohmic relation as $$VGP = Istbr*Rp \qquad (4)$$

$$Vcc - VGN = Istbr*Rn \qquad (5),$$

from Eqs. (2–5) we have $$Istbr = (Vcc-Vtp-Vtn)/(Rp+Rn) \qquad (6)$$

$$PCGV = (Vcc+Vtp-Vtn)/2 + [(1-Rp/Rn)/(1+Rp/Rn)]*(Vcc-Vtp-Vtn)/(2)$$

where Rp is the effective resistance of transistor MPR, and Rn is the effective resistance of transistor MNR.

The transistor MNO in FIG. 1(a) is matched with transistor MN, and transistor MPO is matched with transistor MP so that (Wmno/Wmn)=(Wmpo/Wmp)=Mc, where Wmno is the width of transistor MNO, Wmn is the width of transistor MN, Wmpo is the width of transistor MPO, Wmp is the width of transistor MP, and Mc is the multiplication factor defined by the width ratios of those matched transistors. Since the gate to source voltages of those matched transistors are identical, we will have VOUR=PCGV when Iout is zero. Eq. (7) suggests that the output voltage of the reference voltage generator can be adjusted by adjusting the ratio Rp/Rn that is determined by the sizes of transistors MPR and MNR. The sizes of transistors MN and MP have little effects on PCGV; they are used to adjust the leakage current and the sensitivity of the reference voltage generator.

Figure 1B:
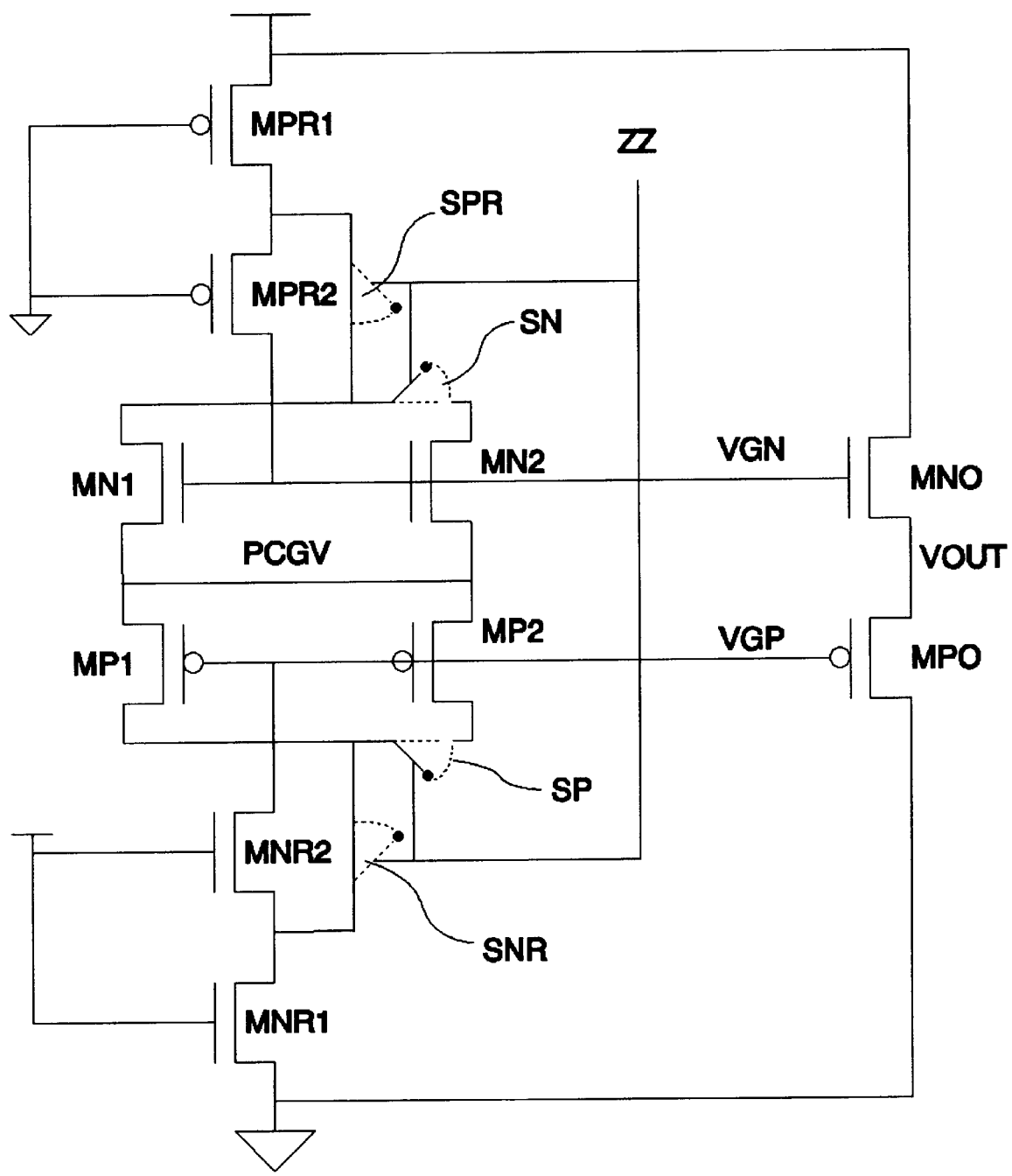
FIG. 1(b) illustrates detailed structures of the circuit in FIG. 1(a)

At steady state, the standby leakage current Istb is $$Istb=Mc*Istbr=Mc*(Vcc-Vtn-Vtp)/(Rn+Rp) \quad (8)$$

which suggest that standby leakage current Istb can be reduced by reducing the width ratio Mc or by increasing (Rp+Rn). However, reducing the standby leakage current Istb will also reduce the driving power of driving transistors MPO and MNO, which will make the output voltage VOUT more noisy when the IC is active. FIG. 1(b) shows detailed structures of the variable size transistors MN, MNR, MF, MPR in FIG. 1(a). In FIG. 1(b), transistors MPR1, MNR2 and switch SPR form the variable size transistor MPR in FIG. 1(a). When the switch control signal ZZ is low, the switch SPR is closed, and the size of the variable transistor MPR is equal to the size of MPR1. When the switch control signal ZZ is high, the switch SPR is open, the size of the variable size transistor MPR is equal to that of two serial transistors MPR1, MPR2, and its effective resistance Rp is increased. In FIG. 1(b), transistors MN1, MN2 and switch SN form the variable size transistor MN in FIG. 1(a). When the switch control signal ZZ is low, the switch SN is open, and the size of the variable transistor MN is equal to the size of MN1. When the switch control signal ZZ is high, the switch SN is closed, the size of the variable size transistor MN is equal to that of two parallel transistors MN1, MN2, and its effective width Wmn is increased. In FIG. 1(b), transistors MNR1, MNR2 and switch SNR form the variable size transistor MNR in FIG. 1(a). When the switch control signal ZZ is low, the switch SNR is closed, and the size of the variable transistor MNR is equal to the size of MNR1. When the switch control signal ZZ is high, the switch SNR is open, the size of the variable size transistor MNR is equal to that of two serial transistors MNR1, MNR2, and the effective resistance Rp is increased. In FIG. 1(b), transistors MP1, MP2 and switch SP form the variable size transistor MP in FIG. 1(a). When the switch control signal ZZ is low, the switch SP is open, and the size of the variable transistor MP is equal to the size of MP1. When the switch control signal ZZ is high, the switch SP is closed, the size of the variable size transistor MP is equal to that of two parallel transistors MP1, MP2, and its effective width Wmp is increased. The sizes of transistor MPR1, MFR2, MNR1, MNR2 are chosen in such as way that Rp/Rn ratio does not change with the switch control signal ZZ. Therefore, the voltage PCGV does not change with ZZ; only the standby current Istb and the driving capability of the reference voltage generator are changed.

The effective sizes of transistors MPR, MNR, MP, MN for a practical example is shown in Table I. In this example, the standby current Istb equals to 0.01 mAmps when the switch control signal ZZ is high, and Istb increase to 5 mAmps when ZZ is low. In the mean time, the driving capability represented by output current Iout increases significantly when ZZ is high as shown in FIG. 1(c).

TABLE I

| | transistor sizes in micrometers. | | | | | |
|---|---|---|---|---|---|---|
| | MPR | MNR | MP | MN | MPO | MNO |
| Width/ Length when ZZ low | 0.7/2.1 | 0.7/8 | 3.2/0.35 | 1.6/0.35 | 2400/0.35 | 1200/0.35 |
| Width/ Length when ZZ high | 0.7/42 | 0.7/160 | 120/0.35 | 60/0.35 | 2400/0.35 | 1200/0.35 |

A reference voltage generator of the present invention can be designed by the following procedures:
   step 1: determine the target value of output voltage PCGV, then calculate Rp/Rn ratio using Eq. (7);
   step 2: based on noise margin, calculate the required driving power of the output transistors MNO, MNP, then determine the sizes of transistors MNR1, MPR1, MN1, MP1;
   step 3: determine the value of tolerable standby leakage current Istb to determine the sizes of transistors MNR2, MPR2, MN2, MP2 according to EQ. (8);
   step 4: design the logic circuit to generate the switch control signal ZZ.

A reference voltage generator of the present invention has many advantages. It is very convenient to adjust its output voltage, driving power, and leakage current The values of output voltage and driving power can be adjusted separately following simple procedures. It has very strong driving power to maintain the reference voltage. Almost all the power consumed by this reference voltage generator is used to maintain its output voltage; there is little wasted power. Its standby power can be reduced by orders of magnitudes using simple control mechanism. There is no need to use feedback circuits or operation amplifiers, so the circuit is extremely stable and reliable. It is an ideal reference voltage generator to generate the bit line pre-charge voltage for a DRAM designed to emulate an SRAM device.

While specific embodiments of the invention have been illustrated and described herein, it is realized that other modifications and changes will occur to those skilled in the art. There are a wide varieties of methods to design variable size transistors. Similar reference voltage generators can be manufactured using bipolar transistors instead of MOS transistors. The gate voltages of transistors MPR, MNR do not always need to be power supplier voltages. For example, we can connect their gates to PCGV to save area. The switches SPR, SNR, SP, SN can be replaced with metal options. We also can use more switches so that each variable transistor can have multiple controllable sizes. The output voltage of the reference voltage generator also can be controlled by programmable signals. These and other modification are considered falling in the spirit of the present invention.

DRAM is more sensitive to alpha particle problem then SRAM because it relies on storage capacitors to hold data. This reliability problem must be solved to make DRAM devices fully compatible to conventional SRAM devices. An error correction code (ECC) mechanism of the present invention is used to correct erroneous data caused by alpha particle problem or other sources of problems such as manufacturing defects. Due to the small dimensions of DRAM memory cells, errors tend to happen at nearby memory cells; therefore, ECC circuits of the present invention must be able to correct erroneous data from nearby memory cells. Another problem for ECC circuit is the delay caused by resistance and capacitance (RC delay) of long metal lines. Error correction logic circuits need to calculate the parity of data distributed in widely separated space; ECC calculation often needs to use long metal lines to collect data. Metal line RC delay became a dominating factor to determine the performance of the ECC circuits. To support high speed operations, this RC delay problem must be solved.

Due to the complexity of the error correction mechanism, we will need to use the array symbol used for C programming language in the following discussions to describe the mechanism. For example, D[3:2][4:1] means a set of 8 symbols D34, D33, D32, D31, D24, D23, D22, and D21. We will also use the symbol "mod" to represent the modulation operation that results in the remain of a divide operation. For example, [(k+3) mod 8] equals 2 when k=7, and [(k−3) mod 8] equals 6 when k=1. The "mod" function is implemented by a rotational relationship in the input connections of actual circuits.

Figure 2A:
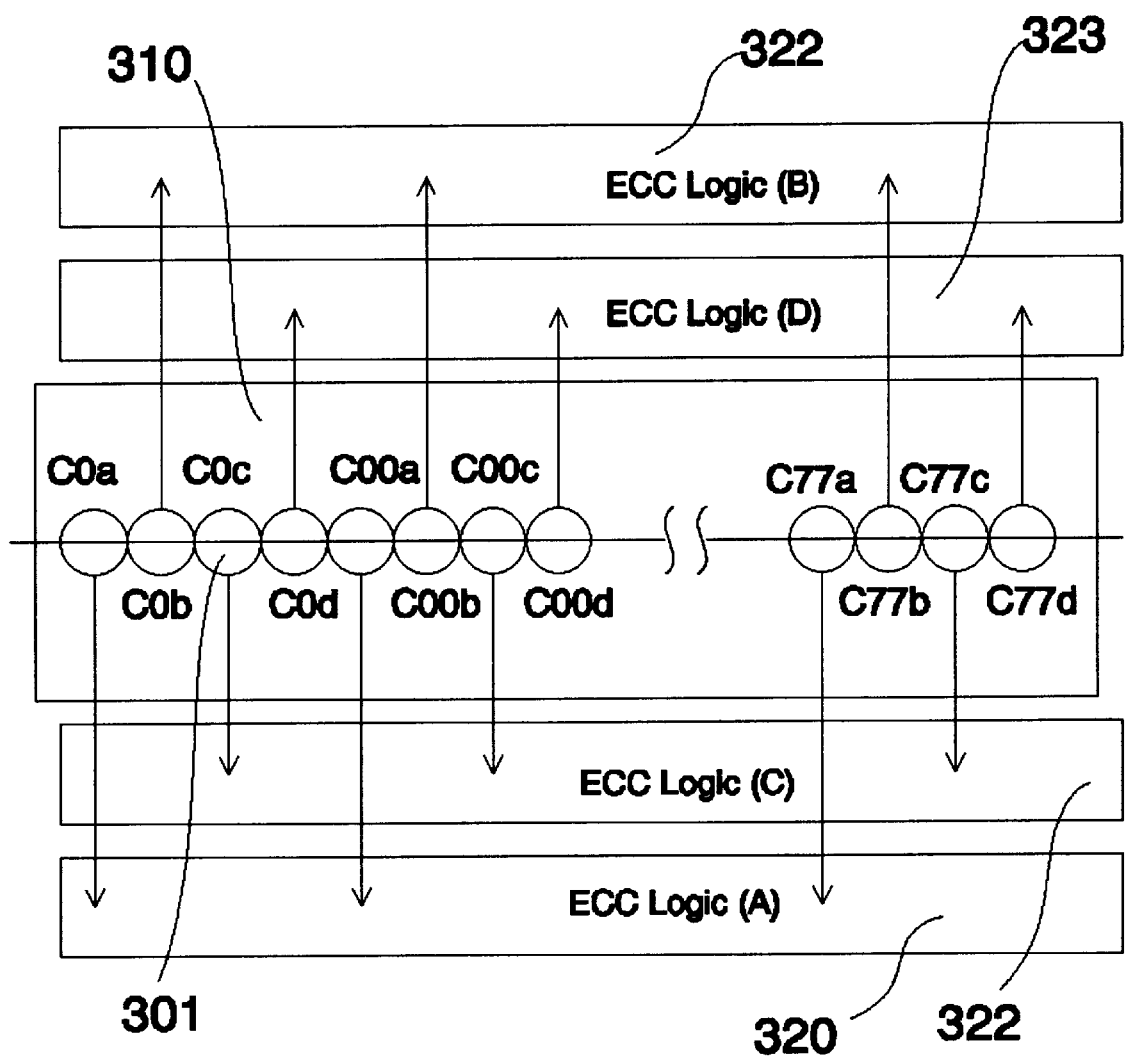
FIG. 2(a) is a high level block diagram of an error correction mechanism of the present invention.
Figure 2B:
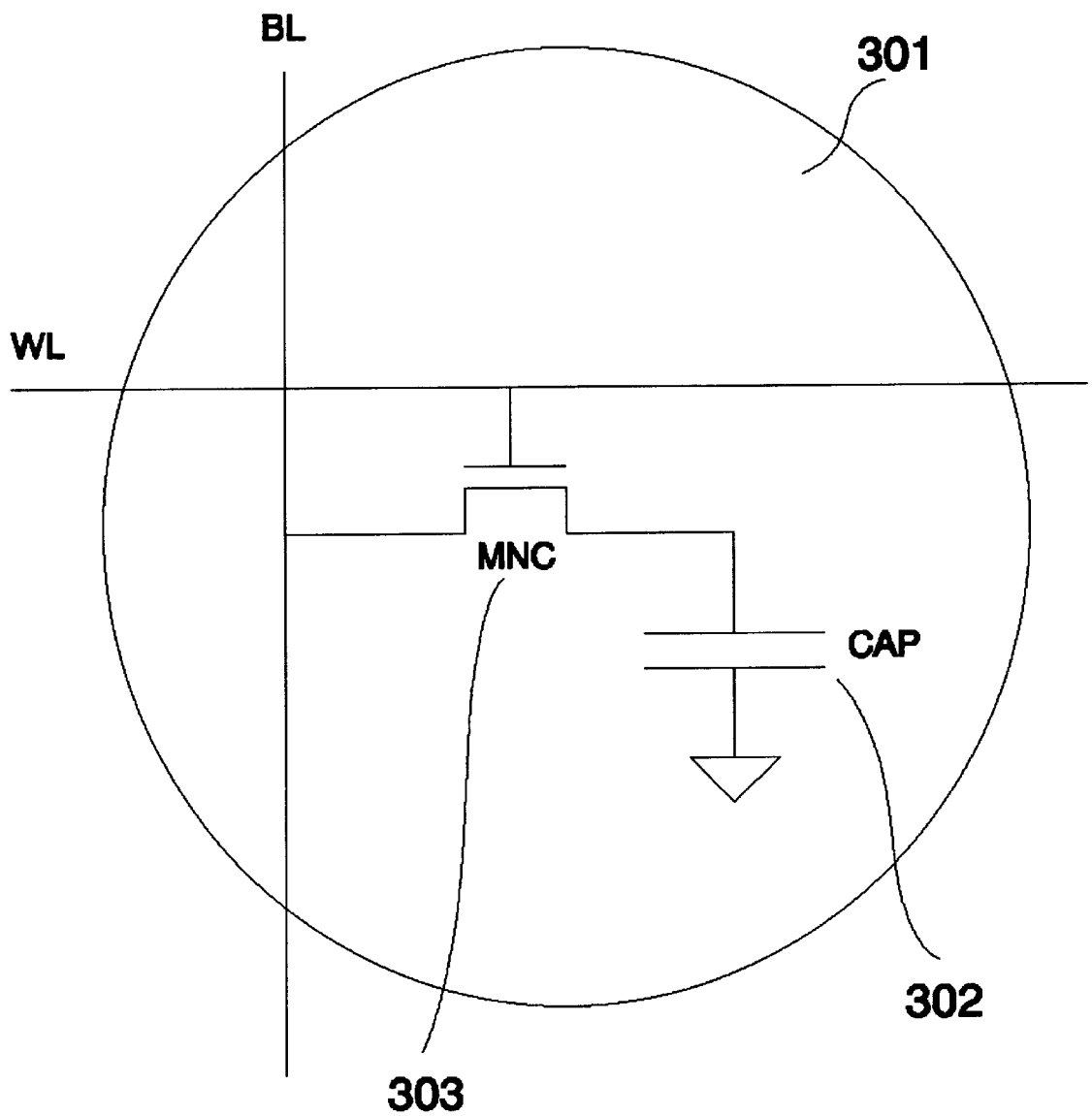
FIG. 2(b) is the schematic diagram of a DRAM cell.
Figure 2C:
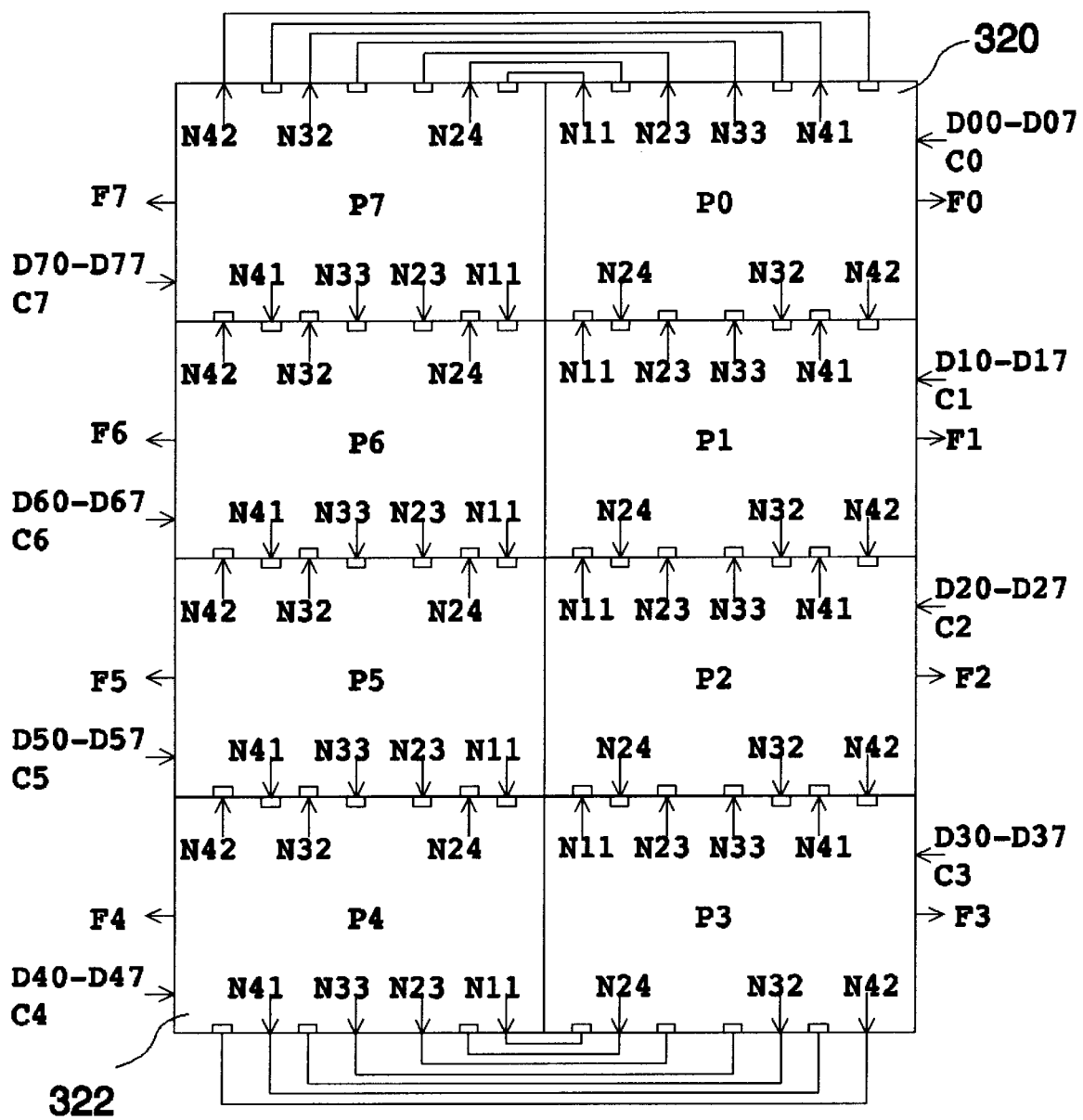
FIG. 2(c) is a block diagram of an error correction parity circuits of the present invention.
Figure 2D:
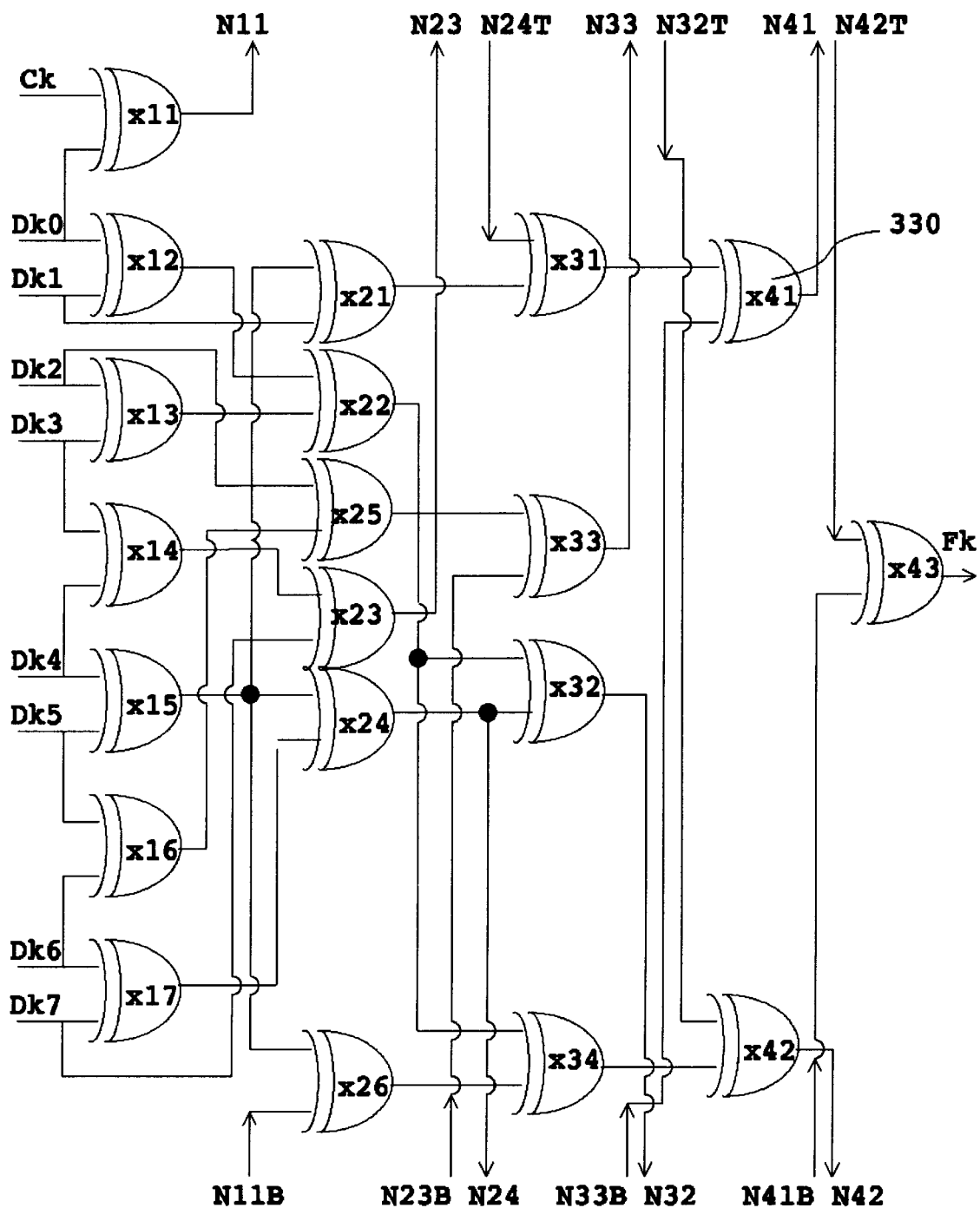
FIG. 2(d) shows details of the circuit block in FIG. 2(c)

FIG. 2(a) is a high level block diagram describing the geometric relationship between an ECC logic circuit of the present invention and DRAM memory cells. Memory cells are represented symbolically by circles (301) in FIG. 2(a). FIG. 2(b) is a schematic diagram of a DRAM memory cell. Each memory cell (301) contains one storage capacitor (302) which is connected to the source of an MOS transistor (303). The gate of the transistor (303) is controlled by a memory word line (WL), and the source of the transistor is connected to a bit line (BL) as shown in FIG. 2(b). During a memory read operation, one word line (WL) is activated to turn on the transistors (303) in all the memory cells (301) connected to the word line. For the example in FIG. 2(a), we assume 288 bits are read from the memory array (310) during a read operation. These data are divided into 4 groups of 72-bit data; each group contains 64 data bits (D[7:0][7:0]) and 8 ECC bits (C[7:0]). The data read from nearby memory cells are sent to different ECC logic circuits (320–323) as shown in FIG. 2(a). Each set of the ECC logic circuits (320–323) is capable of correcting an erroneous data among its 72 input data. Since the data from nearby memory cells are sent to different ECC logic circuits, errors caused by nearby memory cells can be corrected unless more than 5 nearby memory cells are all wrong. FIGS. 2(c,d) are schematic diagrams of one of those 4 sets of ECC logic circuits 320 in FIG. 2(a). The 72 bit inputs to the ECC logic circuit are grouped into 8 sets of data bits D[7:0][7:0], and 8 ECC bits C[7:0]. The ECC logic (320) comprises 8 identical parity circuit blocks (P7–P0). Schematic diagram of the parity circuit is shown in FIG. 2(d). Each parity circuit (P7–P0) comprises 20 exclusive-or gates (330). The parity circuit P[k] takes data D[k][7:0] and ECC bit Ck as inputs, where k is an integer between 0 to 7. It sends four outputs (N11, N23, N33, N41) to the parity circuit on top of it, and receives corresponding outputs (N11B, N23B, N33B, N41B) from the parity circuit below it. It also sends three outputs (N24, N32, N42) to the parity circuit below it, and receives the corresponding outputs (N24T, N32T, N42T) from the parity circuit above it. It also outputs a correction factor Fk to the memory array and to the output correction circuits. Using the schematic diagram in FIG. 2(d), we can determine the logic function of the outputs of the kth parity circuit (P[k]) as $$N11=\text{Parity}\{Ck, Dk0\} \tag{9a},$$

$$N23=\text{Parity}\{Dk3, Dk4, Dk7\} \tag{9b},$$

$$N33=\text{Parity}\{N23B, Dk2, Dk5, Dk6\} \tag{9c},$$

$$N41=\text{Parity}\{N33B, N24T, Dk1, Dk4, Dk5\} \tag{9d},$$

$$N24=\text{Parity}\{Dk4, Dk5, Dk6, Dk7\} \tag{9e},$$

$$N32=\text{Parity}\{Dk0, Dk1, Dk2, Dk3, Dk4, Dk5, Dk6, Dk7\} \tag{9f},$$

$$N42=\text{Parity}\{N32T, N11B, Dk0, Dk1, Dk2, Dk3, Dk4, Dk5\} \tag{9g},$$

and $$Fk=\text{Parity}\{N42T, N41B\} \tag{9h},$$

where "Parity{ }" means the parity value of all the inputs included in "{ }" signs. The inputs (N11B, N22B, N33B, N41B, N24T, N32T, N42T) provided by nearby parity circuits can be determined by the fact that all of those parity circuits in FIG. 2(c) are identical. For example, from Eq. (9a) we know that $$N11B=\text{Parity}\{C[(k+1)\text{mod }8], D[(k+1)\text{mod }8]0\} \tag{10}$$

where C[(k+1) mod 8] is the ECC bit, and D[(k+1) mod 8]0 is the first data connected to the parity circuit below it. All other inputs (N22B, N33B, N41B, N24T, N32T, N42T) can be determined in similar ways; some of them will need to use data and ECC inputs from parity circuits farther away. Based on the connections in FIG. 2(c) and Eqs. (9a–9h), we can conclude that $$Fk=\text{Parity}\{Ck, D[(k-2)\text{ mod }8][7:0], D[(k-1)\text{ mod }8][5:0], D[k][7:4,0], D[(k+1)\text{ mod }8][5,4,1], D[(k+2)\text{ mod }8][6,5,2], D[(k+3)\text{ mod }8][7,4,3]\} \tag{11}$$

where k=(0,1,2,3,4,5,6,7).

During a memory write operation, external data are sent to the parity circuits (320) and the Ck inputs are forced to zero to calculate the ECC bits of the external data. Based on Eq. (11), we have $$ECC(k)=\text{Parity}\{D[(k-2)\text{ mod }8][7:0], D[(k-1)\text{ mod }8][5:0], D[k][7:4,0], D[(k+1)\text{ mod }8][5,4,1], D[(k+2)\text{ mod }8][6,5,2], D[(k+3)\text{ mod }8][7,4,3]\} \tag{12}$$

where ECC(k) is the value of ECC bit, and k=(0,1,2,3,4,5,6,7). These ECC values are written into the memory array together with the input data during a write operation.

Figure 2E:
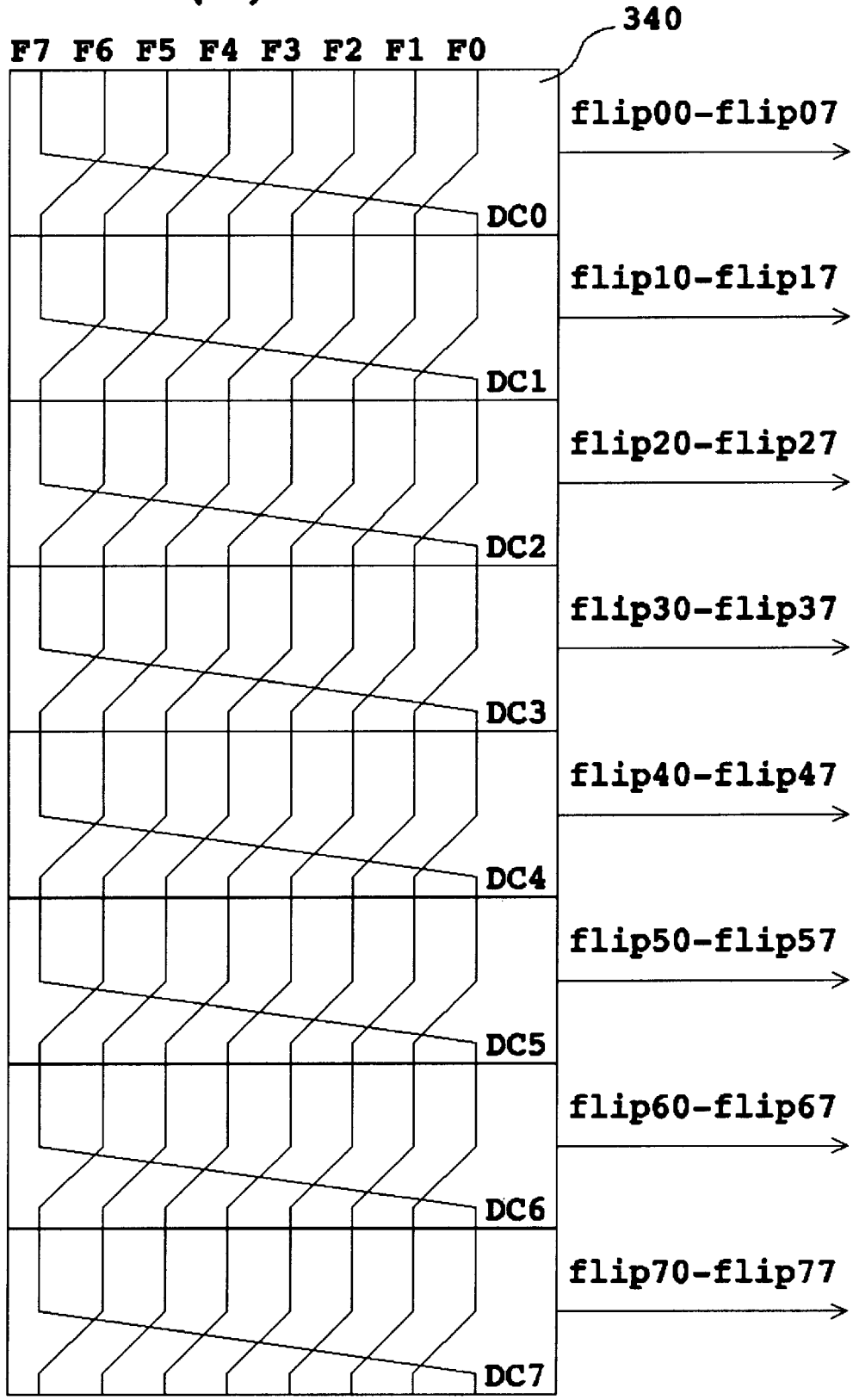
FIG. 2(e) is a block diagram of an error decoder of the present invention.
Figure 2F:
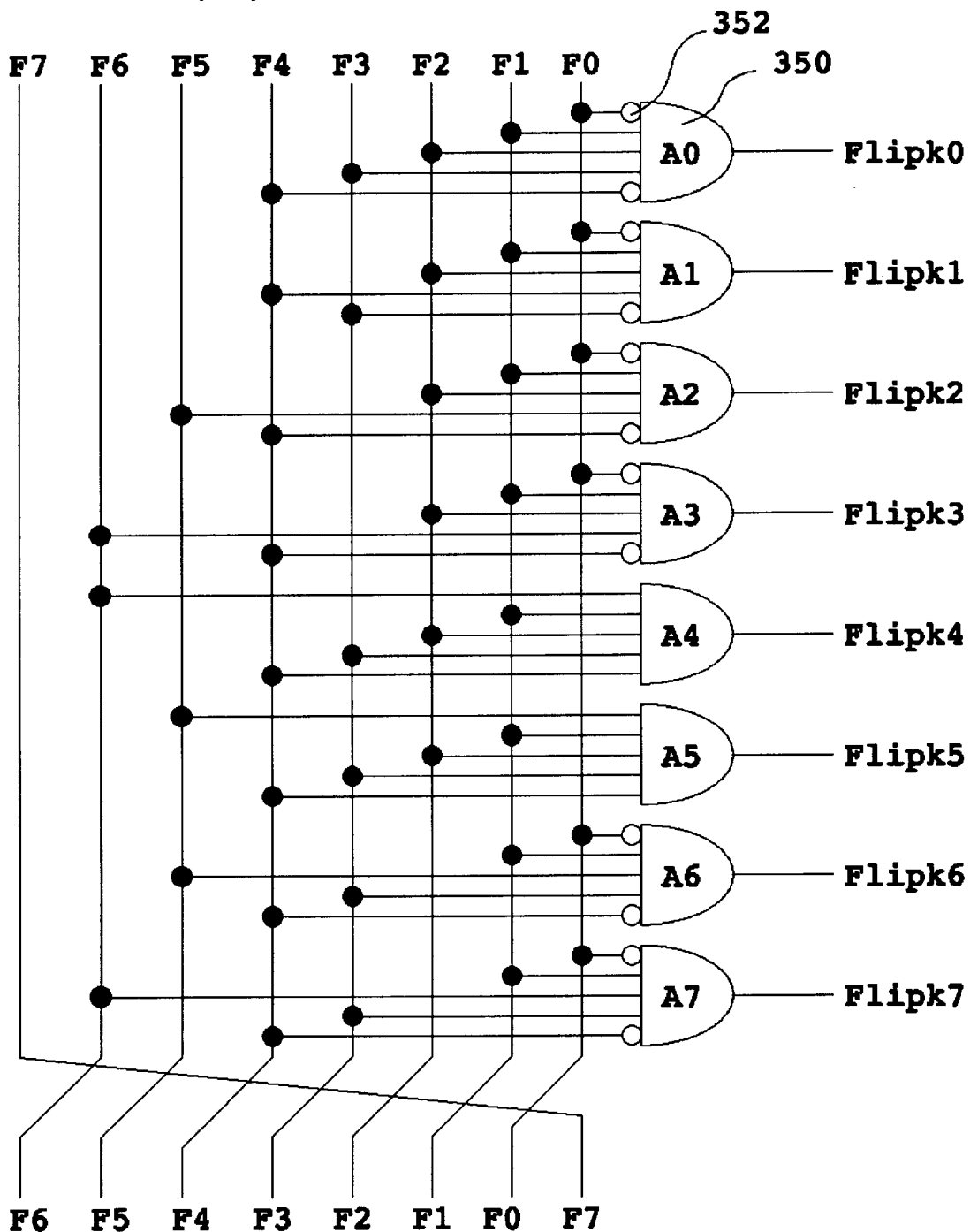
FIG. 2(f) shows details of the decoder in FIG. 2(e)

During a read operation, the data and the stored ECC values are read from the memory, and the correction factors (F7–F0) are calculated using the same parity circuits based on Eq. (11). When there is no error in the 72-bit data, all the error correction factors will be zero. When one of the 72 bit data is wrong, an odd number of the correction factors (F7–F0) will be high. Based on Eq. (12), we know that the failure pattern of the correction bits for each data bit is unique; it is therefore possible to determine which bit is wrong by observing the failure pattern of the correction bits. These error correction factors are sent to an error decoding circuit (340) shown in FIG. 2(e). The error decoding circuit contains eight sets of error decoders (DC7–DC0) as illustrated by the schematic diagram in FIG. 2(f). Each error decoder DC[k] contains eight 5-input AND gates (350). Each one of those AND gates takes five error correction factors as inputs; some of those inputs are inverted as illustrated by the open circles (352) in FIG. 2(f). The inputs to the error decoder DC[k] are rotated to right before they are sent to next error decoder DCk[k−1] as illustrated in FIG. 2(e); in this way, identical layouts for error decoders can be used. The outputs of those AND gates (350) are connected to sixty four flip signals (flip[7:0][7:0]). If the output data are correct, all the flip signals (flip[7:0][7:0]) will be zero. If one bit of the output data is wrong, its corresponding flip signal will be high, and the correct data can be calculated by flipping the polarity of the wrong bit The ECC mechanism of the present invention is novel by the rotation relationship in the parity calculation; parity calculation of C[k+1] is the result of simple rotation of C[k]. This rotational relationship allow us to design circuits that can be used repeatedly in physical layout, which is extremely important for memory devices. The length of metal connection is also minimized because no signals need to travel more than the distance of a small circuit block Speed degradation caused by RC delay is therefore avoided.

While specific embodiments of the invention have been illustrated and described herein, it is realized that other modifications and changes will occur to those skilled in the art. For example, Eq. (12) can be modified to different forms while keeping the rotation relationship. Different numbers of data and correction bits can be used to serve the same purpose. The novel element for the correction mechanism of the present invention is to enforce a rotational relationship in parity calculation of ECC mechanism. Based on the rotational relationship, repeating circuit design can be used to simplify design effort. Higher performance is also achieved by minimizing RC delay.

Figure 3:
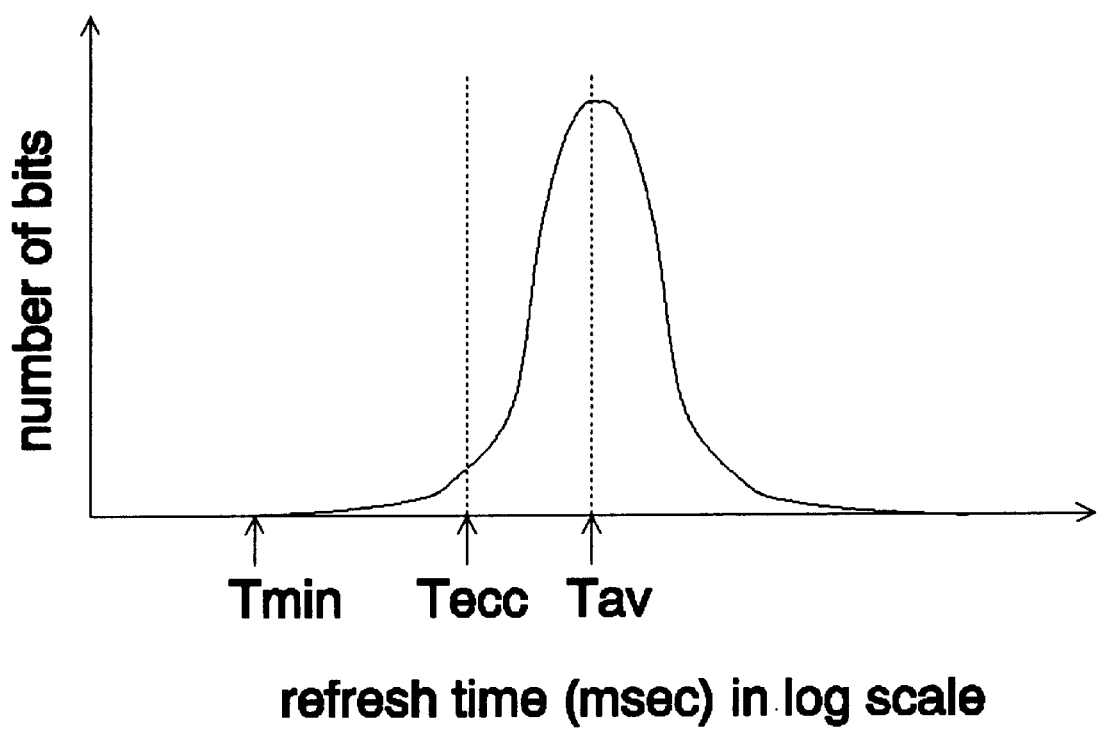
FIG. 3 shows a typical distribution of memory refresh time for all memory cells in a DRAM array.

A memory device equipped with the above ECC protection mechanism will need additional logic circuits and 12.5% more memory cells than a conventional DRAM. However, this does not necessarily mean a DRAM equipped with the ECC circuits of the present invention is larger than a conventional DRAM. One reason is that we no longer need to have redundancy memory arrays because the ECC circuits will correct most of defect problems. Additional area reduction comes from improvements in memory refresh time. DRAM memory cells must be refreshed periodically; otherwise it will lose its storage data due to leakage current The maximum time between two refresh operations is called the "refresh time" for a memory cell. FIG. 3 illustrates a typical distribution of the refresh time for all memory cells in a large DRAM array. The refresh time of most of memory cells follow a normal distribution centered at an average refresh time (Tav). However, there are always a small number of defective memory cells that do not follow normal distributions. These defective memory cells requires much higher refresh rate than normal memory cells. The refresh time of a prior art DRAM is determined by that of the worst memory cell (Tmin) among millions of cells in the IC. Tmin is typically more than two orders of magnitudes lower than the average refresh time. For example, a typical average refresh time for current art DRAM maybe around 50 mini-seconds, while we require refresh time less than 0.2 mini-seconds in order to have reasonable yield. For a DRAM equipped with the ECC protection of the present invention, the refresh period is determined by normal memory cells instead of defective memory cells because the ECC circuits will correct erroneous results from those defective memory cells; the memory refresh period can be much longer than conventional DRAM. There are many ways to take advantage of this improvement in refresh requirement. We can save power by reducing refresh frequency. We can save area by reducing the area of the storage capacitor in memory cells (302). We also can simplify the DRAM manufacture technology by using smaller storage capacitors. For example, a DRAM storage capacitor with two fins can be replaced with a single fin storage capacitor. For the purpose of emulating SRAM using DRAM, we take advantage of the improvement in refresh requirement by simplifying manufacture technology.

Figure 4A:
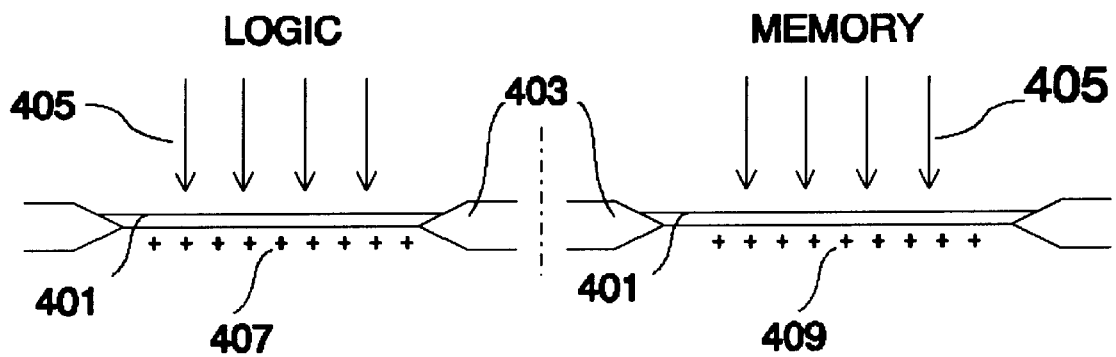
FIGS. 4(a–g) illustrate the manufacture procedures for a prior art high performance IC technology that has both high speed transistor for its logic circuits and low leakage transistors for its DRAM memory cells on the same chip.
Figure 4B:
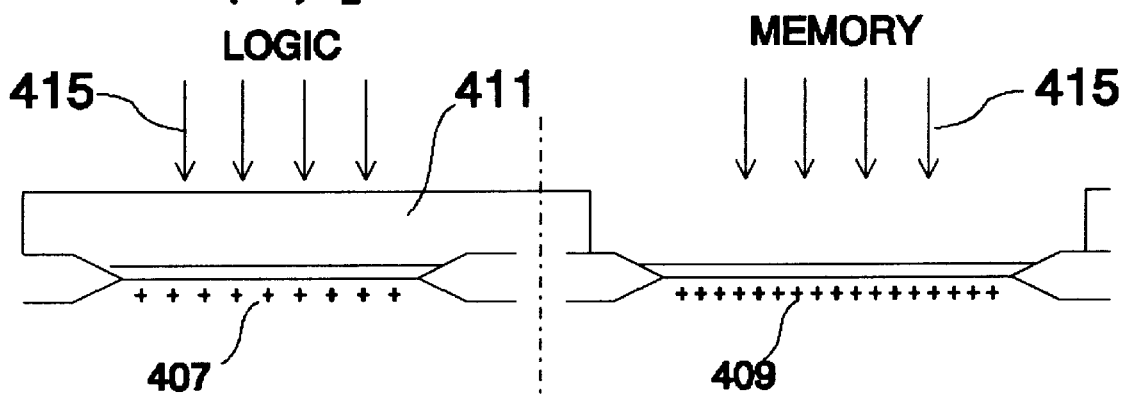
Figure 4C:
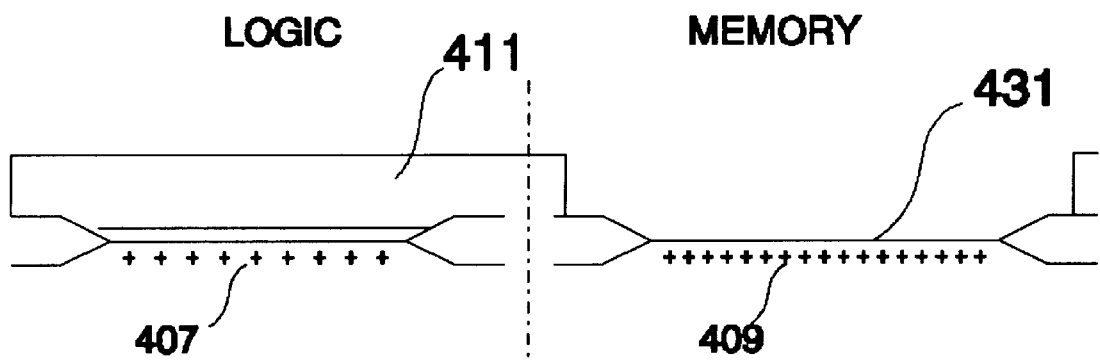
Figure 4D:
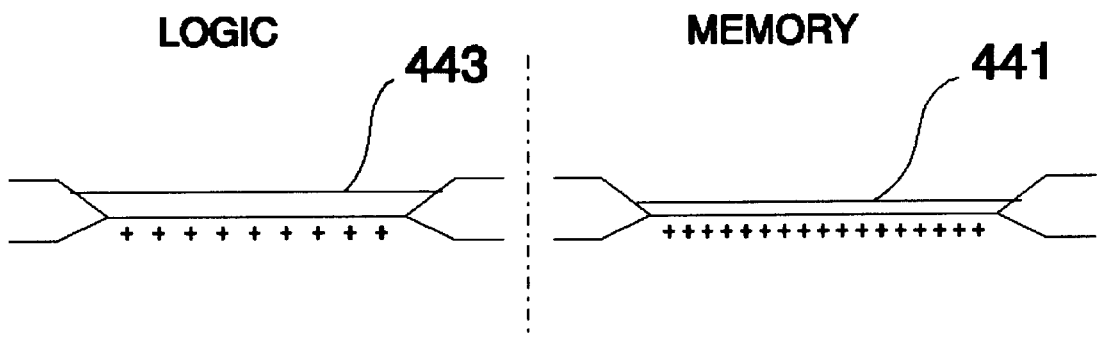
Figure 4E:
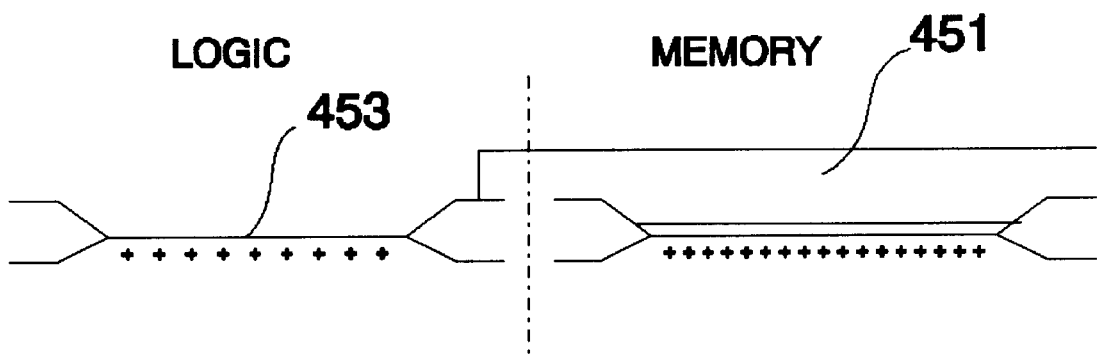
Figure 4F:
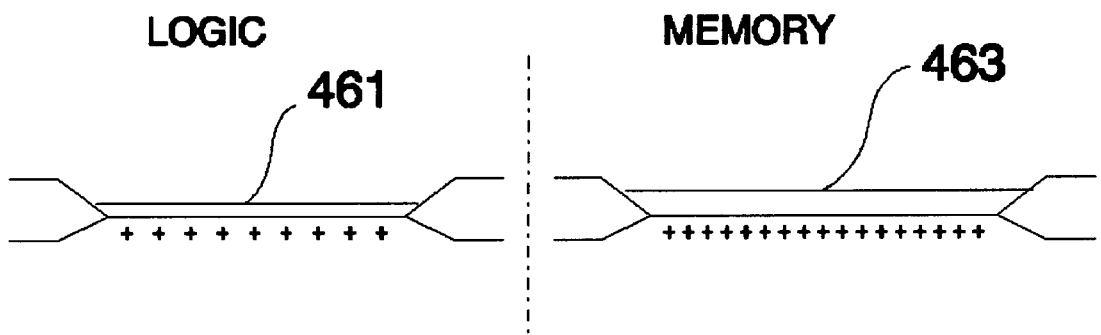
Figure 4G:
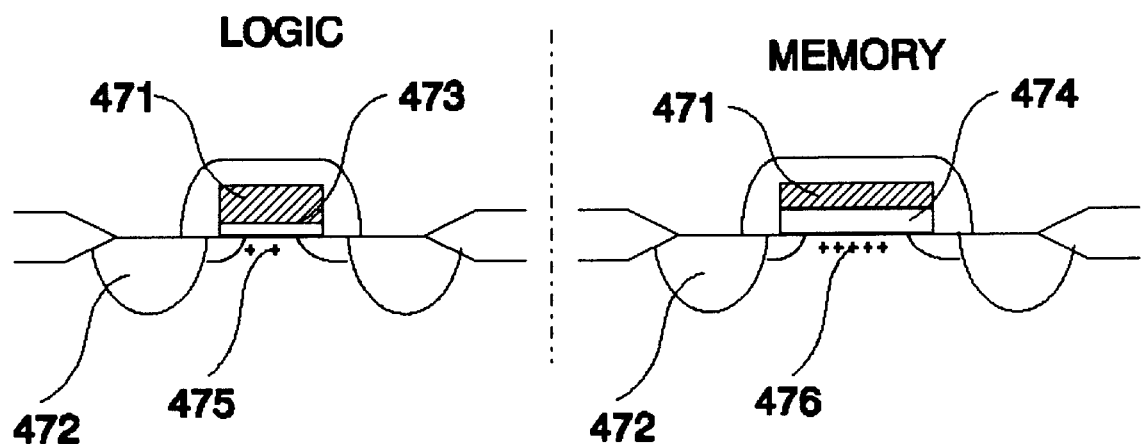

To understand the method to simplify manufacture technology using ECC method, we must understand the limitations of prior art manufacture technologies. To reduce sub-threshold leakage current, the word line transistor (303) for a prior art DRAM cell must be a long channel transistor with high threshold voltage and thick gate oxide. For performance optimization, high speed logic circuits would like to use short channel transistors with low threshold voltage and thin gate oxide. In order to meet those conflicting requirements, we must build both types of transistor on the same IC; the manufacture technology became more complex than a typical logic technology or a typical DRAM technology. FIGS. 4(a-g) illustrate the manufacture procedures for a prior art high performance IC technology that has both high speed transistors for its logic circuits and low leakage transistors for its DRAM memory cells on the same chip. In the following figures, the cross-section diagrams for an n-channel high performance logic transistor are shown in the left hand side, and the cross-section diagrams for an n-channel low leakage memory transistor are shown in the right hand side for comparison. FIG. 4(a) shows such a side-by-side cross section diagram at threshold voltage implantation (Vt implant) procedure. The active areas of transistors are covered by protection oxide layers (401), and the isolation areas are covered by field oxide layers (403). The threshold voltages of the logic transistor is adjusted by ion implantation (405), and positive dopants (407, 409) are implanted into the active areas of both transistors. Since the memory transistor need to have higher threshold voltage and thicker gate oxide, additional implantation is needed. FIG. 4(b) shows that another ion implantation (415) is done when the area of the logic transistor is covered with photo-resist (411). The dopant density in the memory transistor (409) is therefore different from that of the logic transistor (407). The next procedure is to remove the protection oxide (401) in the memory transistor while the photo-resist still protects the area for logic transistor, as illustrated in FIG. 4(c). The photo-resist is then removed, and a thin layer of high quality gate oxide (411) is grown in the memory transistor area as shown in FIG. 4(d); the protection oxide 443 at the logic transistor also grows slightly thicker at this stage. The thickness of the gate oxide (411) is exaggerated in all the following diagrams because it would not be visible if drawn to scale. The next step is to cover the memory transistor with photo-resist (451) and remove the protection oxide (443) in the logic area as shown in FIG. 4(e). The photo-resist (451) is then removed before a thin layer of high quality gate oxide (461) is grown in the logic transistor area as shown in FIG. 4(f). In the mean time, the gate oxide in the memory area (463) is grown thicker. All the following procedures, including poly silicon deposition, definition of gate area, interlayer insulator deposition, lightly-doped-region definition, source/drain implantation, are all identical in both types of transistor. Those procedures are well-known to the art so that there is no need to describe them in details. The final structure of both types of transistor are shown in FIG. 4(g). There are three major difference between the logic transistor in the left hand side and the memory transistor in the right hand side. The gate oxide (473) of the logic transistor is thinner than the gate oxide (474) of the memory transistor. Typical oxide thickness is 7 nm for the logic transistor, and 12 nm for the memory transistor. The channel region doping (475) of the logic transistor is different from the channel region doping (476) of the memory transistor so that they have different threshold voltages. Typical threshold voltage (Vt) for the n-channel logic transistor is around 0.5 volts, while typical threshold voltage for the memory transistor is around 0.7 volts. The thin gate, low Vt transistor is optimized to build high speed logic circuits. The thick gate, high Vt transistor is optimized for low leakage current; it also can tolerate higher gate voltages. This technology allows us to build DRAM devices and high performance logic circuits in the same chip, but it requires at least two more masking steps and many more manufacture procedures; the manufacture cost is increased significantly while yield degrades dramatically. One prior art solution is to use the thick gate, high Vt transistor for both memory and logic circuits. This approach reduces complexity in manufacture technology, but it degrades logic circuit performance dramatically; such technology is only useful to build low end products.

Figure 5A:
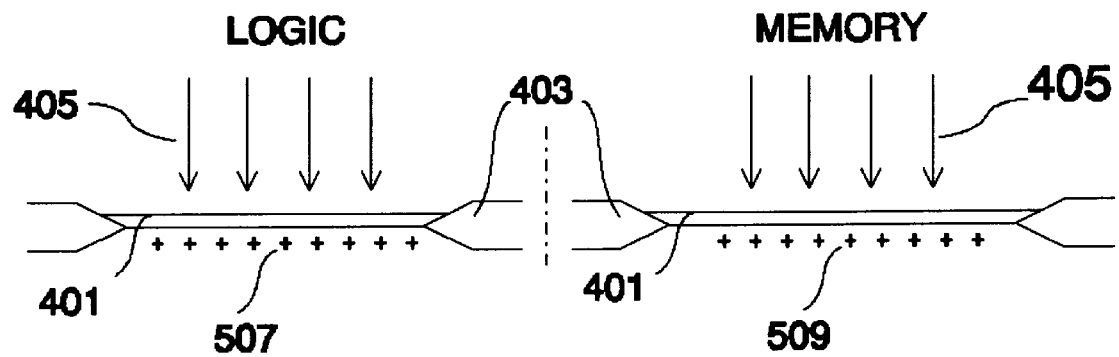
FIGS. 5(a–d) show the manufacture procedures for the high performance integrated circuits of the present invention.
Figure 5B:
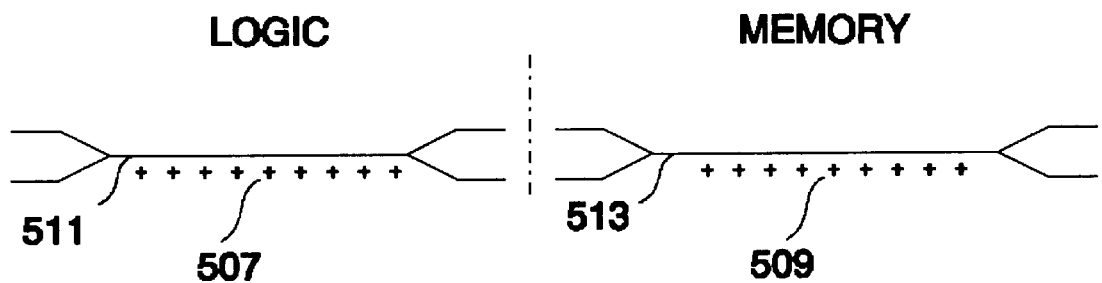
Figure 5C:
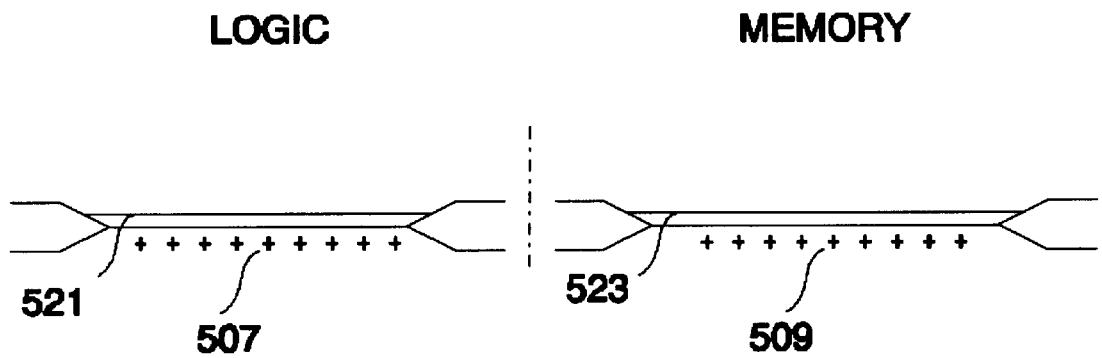
Figure 5D:
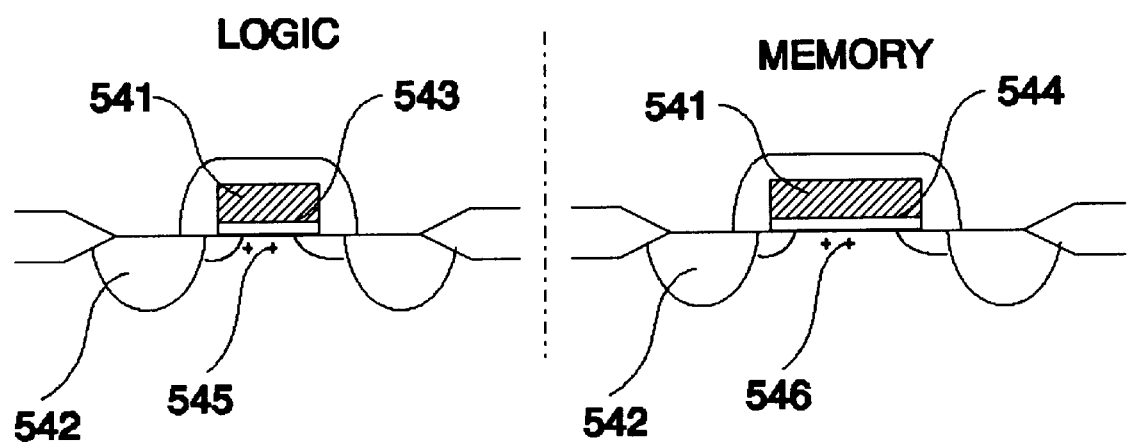

When the DRAM array is equipped with the above ECC protection mechanism, the memory refresh requirement is improved by many orders of magnitudes; we can use the same transistor for logic circuits and for memory cells without any charge retention problem. Using methods described in our previous patent applications, we no longer need to use high word line voltage. Therefore, we can achieve high performance by using logic transistors everywhere, and simplify the manufacture technology at the same time. The manufacture procedures of an embedded DRAM technology of the present invention is illustrated in FIGS. 5(a–c). At the first step, the procedure for Vt implant illustrated in FIG. 5(a) is identical to that in FIG. 4(a). Both the logic transistor and the memory transistor received the same implantation, and their channel doping (507, 509) are identical. The next step is to remove protection oxide (401) from both areas simultaneously as shown in FIG. 5(b). Thin layers of high quality gate oxide (521, 523) are grown in both types of transistors simultaneously, as shown in FIG. 5(c). The resulting transistor devices are illustrated in FIG. 5(d). The logic transistor and the memory transistor have identical gate oxide layers (543, 544) and identical channel structures (545, 546). Therefore, they can be manufactured simultaneously. The manufacture procedures described in FIGS. 4(a–g) use 2 masking steps, one gate oxidation, one ion implantation, and one etching step more than the procedures described in FIGS. 5(a–d). All of those manufacture procedures in FIG. 5(a–d) are known in the of IC industry. The circuit design methods of the present invention make it possible to use simpler manufacture technology to achieve better performance, better reliability, and better yield at lower cost.

Using the ECC protection mechanism of the present invention in DRAM devices provides many advantages over prior art devices. The alpha partide problem is no longer an issue because the ECC circuits can correct errors from multiple nearby bits. There is no need to have redundancy array for the same reason. Our device still can operate at high performance because RC delay problems in prior art ECC circuits is solved by the rotational ECC circuits of the present invention. All the supporting circuits can use repeated layouts, which is very important for memory design. The manufacture technology for embedded IC is simplified dramatically because we can use thin gate transistors for DRAM memory cells.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:

1. An error correction code (ECC) logic circuit for receiving N sets of input data bits $D(i, j)$ and error correction bit $C(i)$, for generating a set of correction bits $F(i)$, where $i=1, 2, 3, \ldots, N$, and $j=1, 2, 3, \ldots, M$, and N and M are positive integers, the error correction code (ECC) logic circuit comprising:

a set of identical parity check blocks ($P(i)$, $i=1, 2, 3, \ldots, N$) wherein each of said parity check blocks $P(i)$ includes an external input means for receiving said input data bits $D(i, j)$ and said error correction bit $C(i)$;

every one of said parity check blocks $P(i)$ further includes a plurality of inter-block bit input lines for directly receiving inter-block input bits from two direct bit-line interconnected parity check blocks $P(i-1)$ and $P(i+1)$ and each of said parity check blocks $P(i)$ further includes a plurality of inter-block bit output lines for directly transmitting inter-block output bits to said two direct bit-line interconnected parity check blocks $P(i-1)$ and $P(i+1)$ wherein a parity check block $P(N)$ having two direct bit-line interconnected parity check blocks of $P(N-1)$ and $P(1)$ for constituting a circular configuration; and every one of said parity check blocks $P(i)$ further includes an external output means for outputting said parity correction bit $F(i)$ wherein a combination of said parity correction bits $\{F(i), i=1, 2, 3, \ldots, N\}$ being provided as a N-bit error decoding input to a set of identical error decoding circuits $\{DC(i)\ i=1, 2, 3, \ldots, N\}$, defined by a combination of said parity correction bits ($F(i)$, $i=1, 2, 3, \ldots N\}$ wherein said combination constituting a single-bit circular shifting relationship, and said error decoding circuits $DC(i)$ generating an unique bit pattern for an error occurring to each of said data bits $D(i, j)$.

2. The ECC logic circuit of claim 1 wherein:

every one of said parity checking blocks $P(i)$, $i=1, 2, 3, \ldots, N$ being arranged physically next to two direct bit line interconnected blocks interconnected by said inter-block input bit lines and inter-block output bit lines and said parity check block $P(N)$ being positioned next to said parity check block $P(1)$ for constituting a circular configuration whereby said inter-block input bit lines and inter-block output bit lines are extended only to a bit-line interconnected parity check block.

3. The ECC logic circuit of claim 1 wherein:

said external input means further includes an input output (I/O) device for aiding operations of error code checking in a reading and writing operations of said data bits $D(i, j)$.

4. The ECC logic circuit of claim 2 further comprising:

a plurality memory cells connected to said I/O device for receiving said N sets of input data bits $D(i, j)$ and said error correction bit $C(i)$; and said I/O device is provided for zeroing out all of said error correction bits $C(i)=0$ for $i=1, 2, 3, \ldots, N$, in a write cycle for generating said parity correction bits $C(i)=F(i)$, $i=1, 2, 3, \ldots N$, for writing said correction bits into said plurality of memory cells.

5. The ECC logic circuit of claim 1 further comprising:

a set of identical error decoding circuits $DC(i)$ with $i=1, 2, 3, \ldots, N$, and each of said external output means of said parity check blocks ($P(i)$, $i=1, 2, 3, \ldots, N$) being connected as input lines, to said set of identical error decoding circuits $DC(i)$, wherein said output means for all of said parity correction bits $\{F(i), i=1, 2, 3, \ldots N\}$ are connected to each one of said error decoding circuits $DC(i+1)$ with a specific sequence of connection wherein said sequence of connection for said $DC(i+1)$ is rotationally shifted by a single bit line from a sequence of connection of said input lines connected to an error decoding circuit $DC(i)$ with $i=1, 2, 3, \ldots N$.

* * * * *

UNITED STATES PATENT AND TRADEMARK OFFICE
CERTIFICATE OF CORRECTION

PATENT NO. : 6,216,246 B1
DATED : April 10, 2001
INVENTOR(S) : Jeng-Jye Shau

It is certified that error appears in the above-identified patent and that said Letters Patent is hereby corrected as shown below:

Title page,
Item [63], Related U.S. Application Data, insert the following phrase:
-- of application No. 08/805,290, filed on Feb, 25, 1997, now Pat. No. 5,825,704, which is a continuation-in-part of application No. 08/653,620,filed on May 24, 1996, now Pat. No. 5,748,547, this application is also a continuation-in-part --

Column 1,
Delete lines 5-6 and insert therein:
   -- This application is a continuation-in-part of application No. 08/805,290, filed on Feb. 25, 1997, now Pat. No. 5,825,704, which is a continuation-in-part of application No. 08/653,620, filed on May 24, 1996, now Pat. No. 5,748,547, and this application is a continuation-in-part of application No. 653,620, filed on May 24, 1996, now Pat. No. 5,748,547. --

Signed and Sealed this

Twenty-first Day of September, 2004

JON W. DUDAS
*Director of the United States Patent and Trademark Office*